US011376957B2

(12) United States Patent
Harris et al.

(10) Patent No.: US 11,376,957 B2
(45) Date of Patent: Jul. 5, 2022

(54) VEHICLE SHIFTER INTERFACE HAVING CAPACITIVE TOUCH ROTARY SHIFTING (71) Applicant: GHSP, Inc., Grand Haven, MI (US)

(72) Inventors: Richard W. Harris, Kentwood, MI (US); Ian P. Sage, Holland, MI (US); Eric W. Bryant, Nunica, MI (US); Todd M. Burghgraef, Caledonia, MI (US)

(73) Assignee: GHSP, Inc., Holland, MI (US)

( * ) Notice: Subject to any disclaimer, the term of this patent is extended or adjusted under 35 U.S.C. 154(b) by 6 days.

(21) Appl. No.: 16/241,387

(22) Filed: Jan. 7, 2019

(65) Prior Publication Data
US 2019/0210458 A1 Jul. 11, 2019

Related U.S. Application Data (60) Provisional application No. 62/613,936, filed on Jan. 5, 2018.

(51) Int. Cl.
*B60K 20/02* (2006.01)
*B60K 37/06* (2006.01)
(Continued)

(52) U.S. Cl.
CPC .............. *B60K 20/02* (2013.01); *B60K 35/00* (2013.01); *B60K 37/06* (2013.01); *F16H 59/12* (2013.01);
(Continued)

(58) Field of Classification Search
CPC ...... F16H 59/12; F16H 59/105; F16H 59/044; F16H 59/08; F16H 59/0278;
(Continued)

(56) References Cited

U.S. PATENT DOCUMENTS 6,295,887 B1  10/2001  DeJonge et al.
7,441,913 B2 * 10/2008  Bayersdorfer ...... F16H 59/0278
                                            362/23.11
(Continued)

FOREIGN PATENT DOCUMENTS

DE           4120975 A1 *  1/1993  ............... G05G 1/06
DE     102007013507 A1 *  9/2008  ........... B60N 2/0224
(Continued)

OTHER PUBLICATIONS

EPO Translation of the Description of DE 102012206661 A1, Horst et al., Oct. 24, 2013. (Year: 2021).*

Primary Examiner — Daniel D Yabut
(74) Attorney, Agent, or Firm — Price Heneveld LLP (57) ABSTRACT A vehicle shifter interface including a protruding contoured member including an outer surface having a first contour with a round shape and a second contour; a first set of capacitive touch sensor pads disposed on an inner surface of the protruding contoured member in an area underlying the first contour, the first set of capacitive touch sensor pads arranged to provide output signals in response to a rotary movement of a driver's fingers about the round shape of the first contour thereby indicating a change in gear selection; and a second set of capacitive touch sensor pads disposed on the inner surface in an area underlying the second contour, the second set of capacitive touch sensor pads arranged and configured to provide output signals in response to at least one of a position of a driver's finger on the second contour and a change of position of a driver's finger.

5 Claims, 6 Drawing Sheets (51) Int. Cl.
*H03K 17/96* (2006.01)
*F16H 59/12* (2006.01)
*H03K 17/955* (2006.01)
*B60K 35/00* (2006.01)

(52) U.S. Cl.
CPC ....... *H03K 17/955* (2013.01); *H03K 17/9622* (2013.01); *B60K 2370/141* (2019.05); *B60K 2370/143* (2019.05); *B60K 2370/1434* (2019.05); *B60K 2370/158* (2019.05)

(58) Field of Classification Search
CPC ........... F16H 59/0204; F16H 2059/082; F16H 2059/081; F16H 2059/0221; F16H 2059/026; B60K 20/02; B60K 20/08; B60K 20/04; B60K 37/06; H03K 17/955; H03K 17/9622
See application file for complete search history.

(56) References Cited

U.S. PATENT DOCUMENTS

| | | | | |
|---|---|---|---|---|
| 10,496,188 | B2* | 12/2019 | O'Conaire | G06F 3/03543 |
| 2008/0007525 | A1* | 1/2008 | Sim | G06F 3/03543 |
| | | | | 345/163 |
| 2010/0245246 | A1* | 9/2010 | Rosenfeld | G06F 3/0383 |
| | | | | 345/163 |
| 2011/0241993 | A1* | 10/2011 | Shih | G06F 3/03543 |
| | | | | 345/163 |
| 2013/0009913 | A1* | 1/2013 | Lin | G06F 3/03543 |
| | | | | 345/175 |
| 2013/0120129 | A1* | 5/2013 | Tippelhofer | F16H 59/0217 |
| | | | | 340/456 |
| 2013/0269463 | A1* | 10/2013 | Lindner | F16H 59/105 |
| | | | | 74/473.3 |
| 2014/0020496 | A1* | 1/2014 | Heo | F16H 59/105 |
| | | | | 74/473.12 |
| 2014/0149909 | A1* | 5/2014 | Montes | B60K 20/08 |
| | | | | 715/771 |
| 2014/0283639 | A1* | 9/2014 | Kim | F16H 59/08 |
| | | | | 74/473.12 |
| 2014/0309896 | A1* | 10/2014 | Lindner | F16H 59/044 |
| | | | | 701/53 |
| 2014/0318295 | A1* | 10/2014 | Kim | F16H 59/08 |
| | | | | 74/473.12 |
| 2016/0137063 | A1* | 5/2016 | Fribus | F16H 59/08 |
| | | | | 74/473.12 |
| 2016/0334008 | A1* | 11/2016 | Park | F16H 59/044 |
| 2016/0378320 | A1* | 12/2016 | Suzuki | G06F 3/016 |
| | | | | 345/158 |
| 2017/0078465 | A1* | 3/2017 | Ito | G06F 3/1423 |
| 2017/0146414 | A1* | 5/2017 | Ben Abdelaziz | G01L 5/22 |
| 2017/0326984 | A1* | 11/2017 | Ling | B60R 16/023 |
| 2018/0232115 | A1* | 8/2018 | Tanaka | G06F 3/0482 |
| 2019/0155415 | A1* | 5/2019 | Kato | G06F 3/0445 |

FOREIGN PATENT DOCUMENTS

| | | | | |
|---|---|---|---|---|
| DE | 102012206661 | A1 * | 10/2013 | ......... H03K 17/9622 |
| DE | 102016124415 | A1 * | 6/2018 | ............. B60K 35/00 |
| FR | 2990778 | A1 * | 11/2013 | ......... G06F 3/03547 |
| WO | 2018217865 | A1 | 11/2018 | |

* cited by examiner

VEHICLE SHIFTER INTERFACE HAVING CAPACITIVE TOUCH ROTARY SHIFTING

CROSS-REFERENCE TO RELATED APPLICATION

This application claims priority to and the benefit under 35 U.S.C. § 119(e) of U.S. Provisional Patent Application No. 62/613,936, filed on Jan. 5, 2018, entitled "VEHICLE SHIFTER INTERFACE HAVING CAPACITIVE TOUCH ROTARY SHIFTING," by Richard W. Harris et al., the entire disclosure of which is incorporated herein by reference.

FIELD OF THE INVENTION

The present invention generally relates to a human-machine interface for a vehicle, and more particularly, relates to a vehicle shifter module having a human-machine interface providing at least a gear selection function.

BACKGROUND OF THE INVENTION

Vehicle shifter modules have typically included either a stick-type shifter that is physically moved to different gear selection positions or a rotary knob that is rotated to different gear selection positions. Both of these approaches require the use of parts that physically move relative to one another and thus are prone to wear and are relatively complex and costly to manufacture.

SUMMARY OF THE INVENTION

According to one aspect of the present invention, a vehicle shifter interface is provided comprising a protruding contoured member including an outer surface having a first contour with a round shape and a second contour with a flat shape, the protruding contoured member further having an inner surface; a first set of capacitive touch sensor pads disposed on the inner surface of the protruding contoured member in an area underlying the first contour, the first set of capacitive touch sensor pads arranged and configured to provide output signals in response to a rotary movement of a driver's fingers about the round shape of the first contour thereby indicating a change in gear selection; and a second set of capacitive touch sensor pads disposed on the inner surface of the protruding contoured member in an area underlying the second contour, the second set of capacitive touch sensor pads arranged and configured to provide output signals in response to at least one of a position of a driver's finger on the second contour and a change of position of a driver's finger along the second contour.

According to another aspect of the present invention, a vehicle shifter interface is provided comprising a protruding contoured member including an outer surface having a first contour with a round shape and a top contour disposed on the top of the protruding contoured member, the protruding contoured member further having an inner surface; a first set of capacitive touch sensor pads disposed on the inner surface of the protruding contoured member in an area underlying the first contour, the first set of capacitive touch sensor pads arranged and configured to provide output signals in response to a rotary movement of a driver's fingers about the round shape of the first contour thereby indicating a change in gear selection; and a capacitive touch sensor pad disposed on the inner surface of the protruding contoured member in an area underlying the top contour, the capacitive touch sensor pad configured to provide output signals in response to a detection of a driver's finger at the top contour.

According to another aspect of the present invention, a vehicle shifter interface is provided comprising a protruding contoured member including an outer surface having a first contour with a round shape, the protruding contoured member further having an inner surface; a first set of capacitive touch sensor pads disposed on the inner surface of the protruding contoured member in an area underlying the first contour, the first set of capacitive touch sensor pads arranged and configured to provide output signals in response to a rotary movement of a driver's fingers about the round shape of the first contour thereby indicating a change in gear selection; and a haptic feedback generator for generating haptic feedback upon detection touching of the first contour of the protruding contoured member.

These and other features, advantages, and objects of the present invention will be further understood and appreciated by those skilled in the art by reference to the following specification, claims, and appended drawings.

BRIEF DESCRIPTION OF THE DRAWINGS

The present invention will become more fully understood from the detailed description and the accompanying drawings, wherein.

DETAILED DESCRIPTION OF THE EMBODIMENTS

Figure 1:
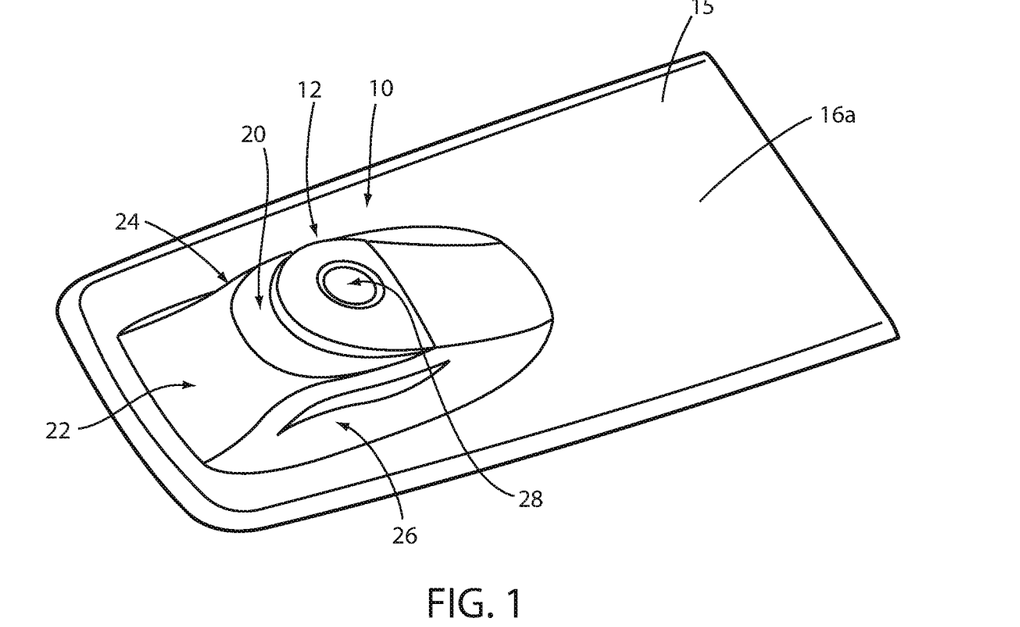
FIG. 1 is a perspective view showing the top, left side and front side of a vehicle shifter interface.
Figure 2:
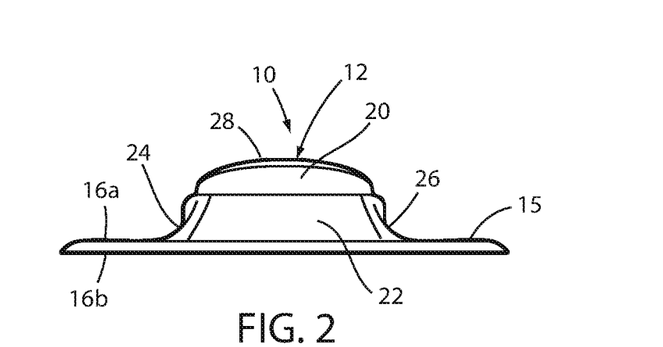
FIG. 2 is an elevation view of the front side of the vehicle shifter interface of FIG. 1.
Figure 3:
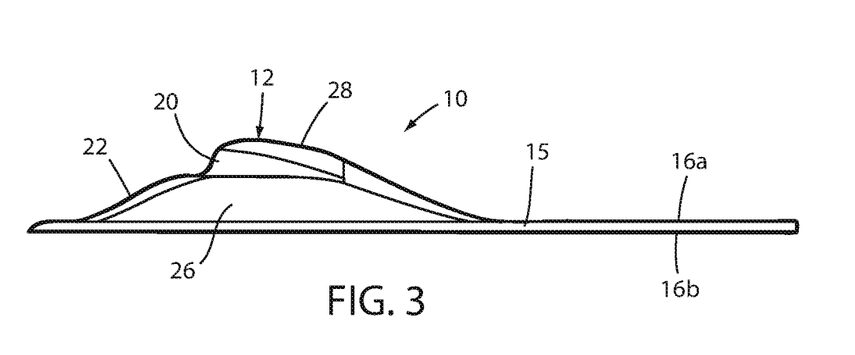
FIG. 3 is an elevation view of the left side of the vehicle shifter interface of FIG. 1.
Figure 4:
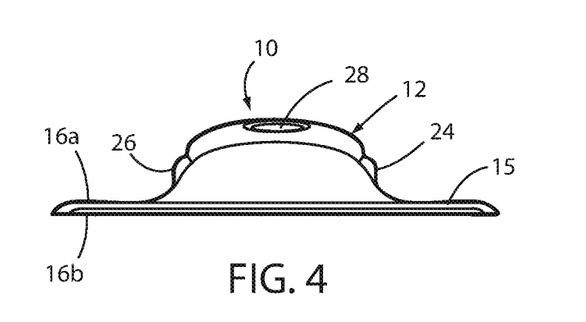
FIG. 4 is an elevation view of the rear side of the vehicle shifter interface of FIG. 1.
Figure 5:
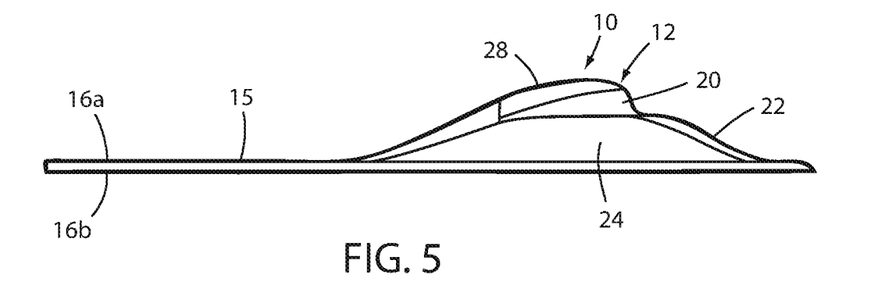
FIG. 5 is an elevation view of the right side of the vehicle shifter interface of FIG. 1.
Figure 6:
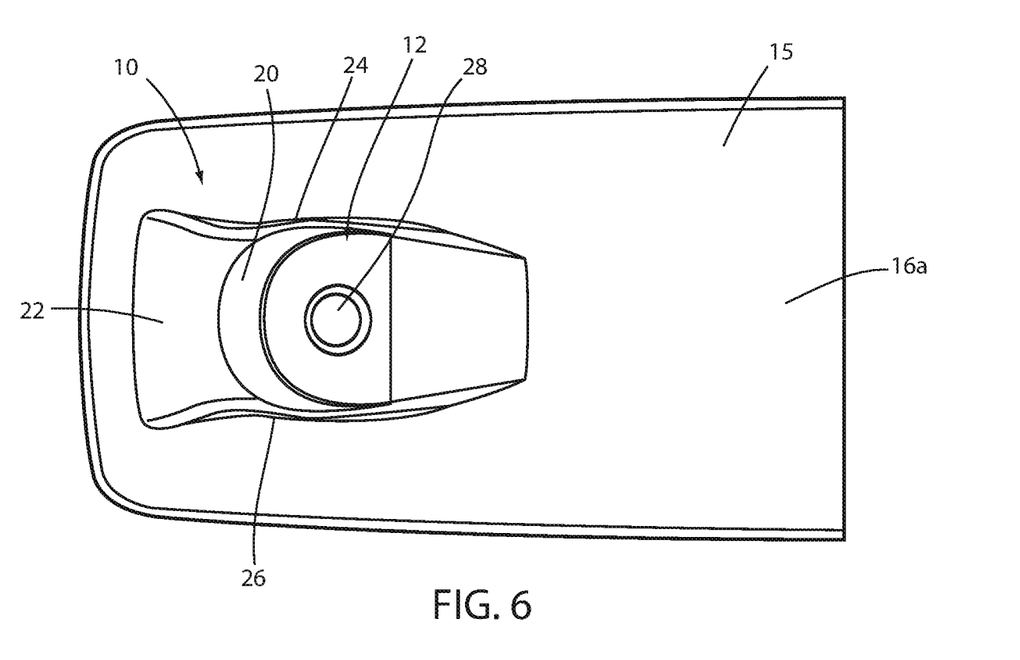
FIG. 6 is a plan view of the top of the vehicle shifter interface of FIG. 1.

For purposes of description herein the terms "upper," "lower," "right," "left," "rear," "front," "vertical," "horizontal," and derivatives thereof shall relate to the device as oriented in FIG. 2 where the "front of the shifter module is closer to the front of a vehicle in which the shifter module is installed. However, it is to be understood that the device may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As noted above, prior shifter modules have required moving parts that are moved in response to actuation by a driver of the vehicle in which the shifter module is installed. The use of such moving parts introduces the potential for wear and increased cost of production. Further, moving parts provide for the possibility of liquid egress between the moving parts. The embodiment described below does not use moving parts and therefore can be implemented at a lower cost than traditional vehicle shifter modules. In addition, the vehicle shifter module is lighter and much less complex. Further, it may be integrated into the surface of a center console or armrest of the vehicle such that they share the same outer surface.

FIGS. 1-6 illustrate an embodiment of a vehicle shifter interface 10, which has a protruding contoured member 12 that may be integrated into a center console or armrest (collectively referred to by reference numeral 15). The protruding contoured member 12 includes an outer surface 16a having a first contour 20 with a round shape and a second contour 22 with a flat shape. The second contour 22 may be provided forward of the first contour 20. The outer surface 16a may also have a third contour 24 and a fourth contour 26 arranged along the sides of the protruding contoured member 12. In addition, the outer surface 16a may also have a fifth contour 28 arranged at the top or rear of the protruding contoured member 12. The protruding contoured member 12 further has an inner surface 16b. The protruding contoured member 12 may generally have an ergonomic shape that conforms to the driver's fingers and distal portion of the driver's palm.

Figure 7:
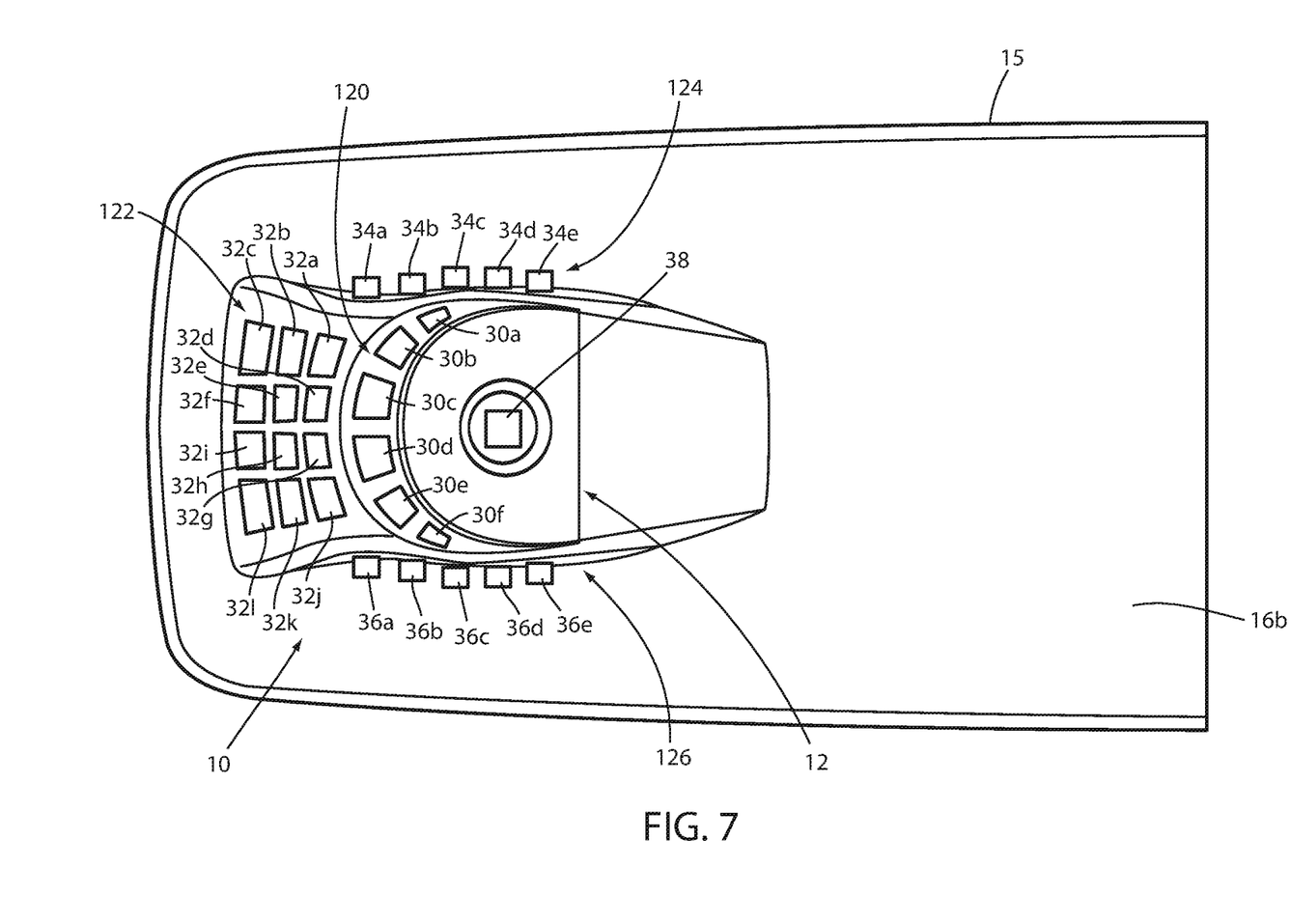
FIG. 7 is a plan view of the bottom of the vehicle shifter interface of FIG. 1.

As shown in FIG. 7, a first set 120 of capacitive touch sensor pads 30a-30f may be disposed on the inner surface 16b of the protruding contoured member 12 in an area underlying the first contour 20. The first set 120 of capacitive touch sensor pads 30a-30f is arranged and configured to provide output signals in response to a rotary movement of a driver's fingers about the round shape of the first contour 20 thereby indicating a change in gear selection.

A second set 122 of capacitive touch sensor pads 32a-32l may be disposed on the inner surface 16b of the protruding contoured member 12 in an area underlying the second contour 22. The second set 122 of capacitive touch sensor pads 32a-32l is arranged and configured to provide output signals in response to either or both of a position of a driver's finger on the second contour 22 and a change of position of a driver's finger along the flat shape of the second contour 22.

A third set 124 of capacitive touch sensor pads 34a-34e may be disposed on the inner surface 16b of the protruding contoured member 12 in an area underlying the third contour 24, which is provided on the right side of the contoured member 12. The third set 124 of capacitive touch sensor pads 34a-34e is arranged and configured to provide output signals in response to a change of position of a driver's finger along the third contour 24.

A fourth set 126 of capacitive touch sensor pads 36a-36e may be disposed on the inner surface 16b of the protruding contoured member 12 in an area underlying the fourth contour 26, which is provided on the left side of the contoured member 12. The fourth set 122 of capacitive touch sensor pads 36a-36e is arranged and configured to provide output signals in response to a change of position of a driver's finger along the fourth contour 26.

A capacitive touch sensor pad 38 may be disposed on the inner surface 16b of the protruding contoured member 12 in an area underlying the fifth contour 28, which is provided as a recess in the top of the contoured member 12. The capacitive touch sensor pad 38 is arranged and configured to provide an output signal in response to touching by a driver's finger in the fifth contour 28.

Figure 8:
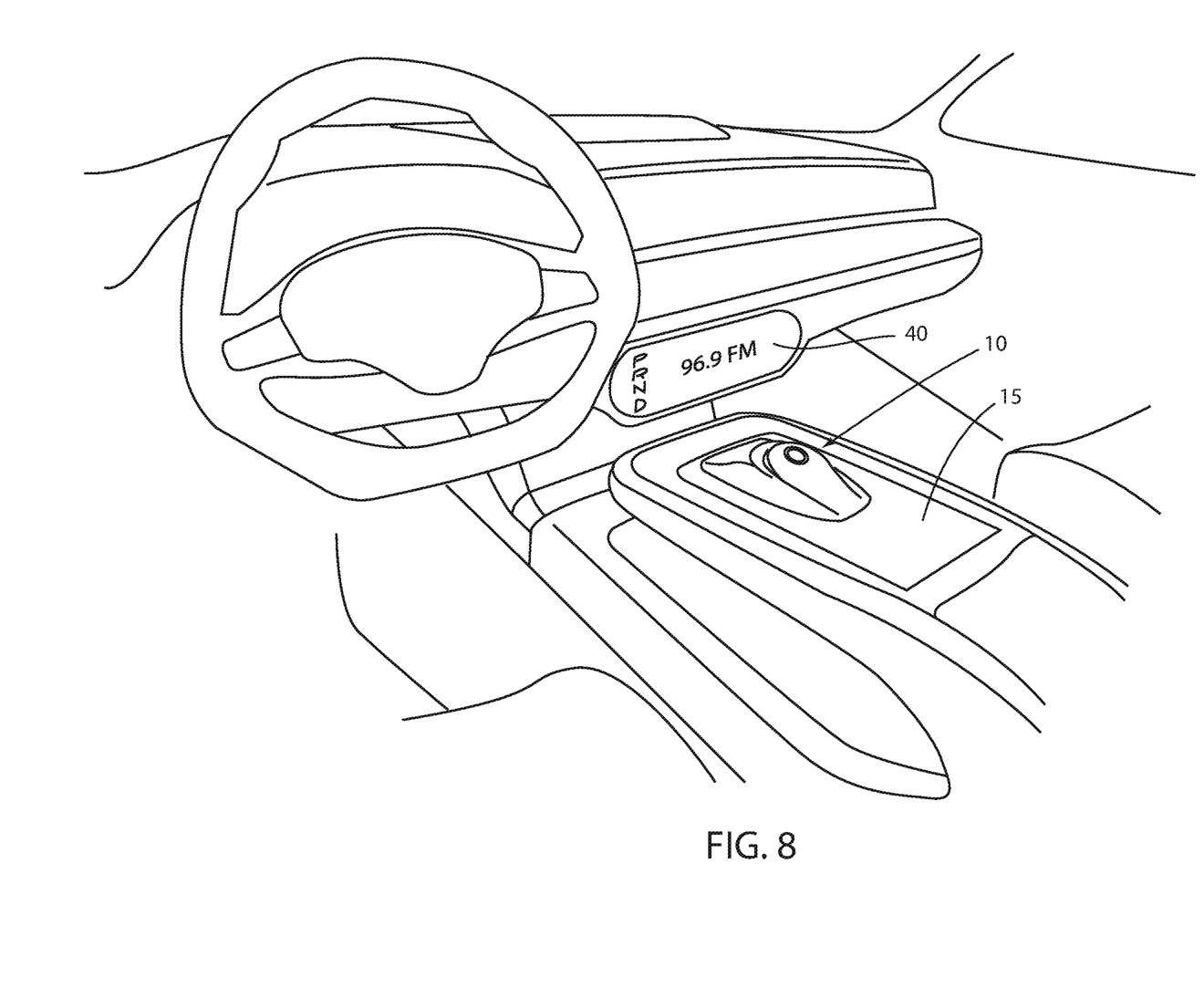
FIG. 8 is a perspective view of an interior of a portion of a vehicle in which the vehicle shifter interface is installed.

The vehicle shifter interface 10 may be integrated into any component within the vehicle and in particular may be integrated into a center console or armrest 15 of the vehicle such that the interface 10 is located in a natural position of reach for the driver. FIG. 8 illustrates an example where the shifter interface is integrated into an armrest 15. Such integration may be accomplished by forming the protruding contoured member 12 directly in the upper surface of a center console or armrest 15. This provides a seamless machine/human interface 10 that may be used for more than simply gear selection by the driver. More specifically, the first contour 20 allows for a rotary input by the driver that may be used to select a gear of the vehicle transmission. As such, the gear selection may be rotated between park, reverse, neutral, drive, and optionally low gear selections. The gear that is selected may be displayed on a vehicle display 40 so as to provide feedback to the driver of which gear is selected.

Although the first contour 20 is described above as being useful for gear selection, the first contour 20 may alternatively or additionally be used for all natural rotary control in a vehicle, such as radio volume or tuning, HVAC control, etc. If the first contour 20 is used for multiple functions, the vehicle controller(s) may be configured to require selection of the particular function prior to accepting input from rotary motion about the first contour 20.

The second contour 22 and associated capacitive touch sensor pads 32a-32l may be configured to function similar to a track pad commonly found on a laptop computer. Thus, the X- and Y-position of a driver's finger may be detected as well as movement in either or both of the X- and Y-directions. Thus, the second contour 22 could function as an input for a display 40 and thereby scrolling horizontally or vertically along the display 40. Further, it may be used as a dial pad for a telephone or an input pad for entering letters or numbers.

The third contour 24 and associated capacitive touch sensor pads 34a-34e may be configured to function as a scroll input similar to the scroll wheel on a computer mouse. Thus, by sliding one's finger along the third contour 24, one may cause a display to scroll up/down in a vertical direction.

The fourth contour 26 and associated capacitive touch sensor pads 36a-36e may be configured to function as a scroll input similar to the scroll wheel on a computer mouse. By sliding one's finger along the fourth contour 26, one may cause a display to scroll left/right in a horizontal direction.

The fifth contour 28 and associated capacitive touch sensor pad 38 may be configured to function as a start/stop button for the vehicle ignition and/or may be configured to indicate a selection/confirm/enter input.

Figure 9:
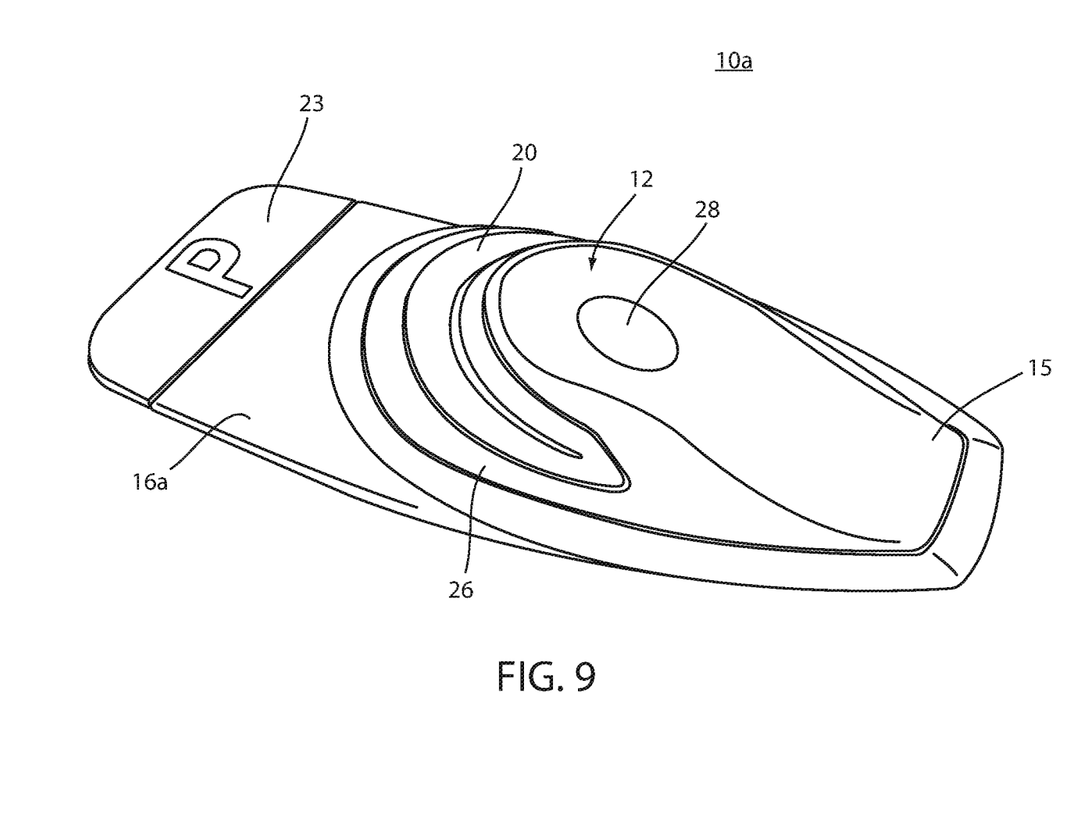
FIG. 9 is perspective view of a variation of the vehicle shifter interface of FIG. 1.

Although five different contours are disclosed herein for providing five different input functions, additional input contours or fewer input contours may be provided. Thus any one or combination of the input contour may be provided. Further, additional or alternative functions may be provided for each of the input contours. For example, as shown in FIG. 9, the second contour 22 of FIG. 1 and associated set 122 of capacitive sensor pads have been replaced with a display 23. Display 23 may be provided to display any information. Such information may include, for example, a PRND or PRNDM gear selection.

Figure 10:
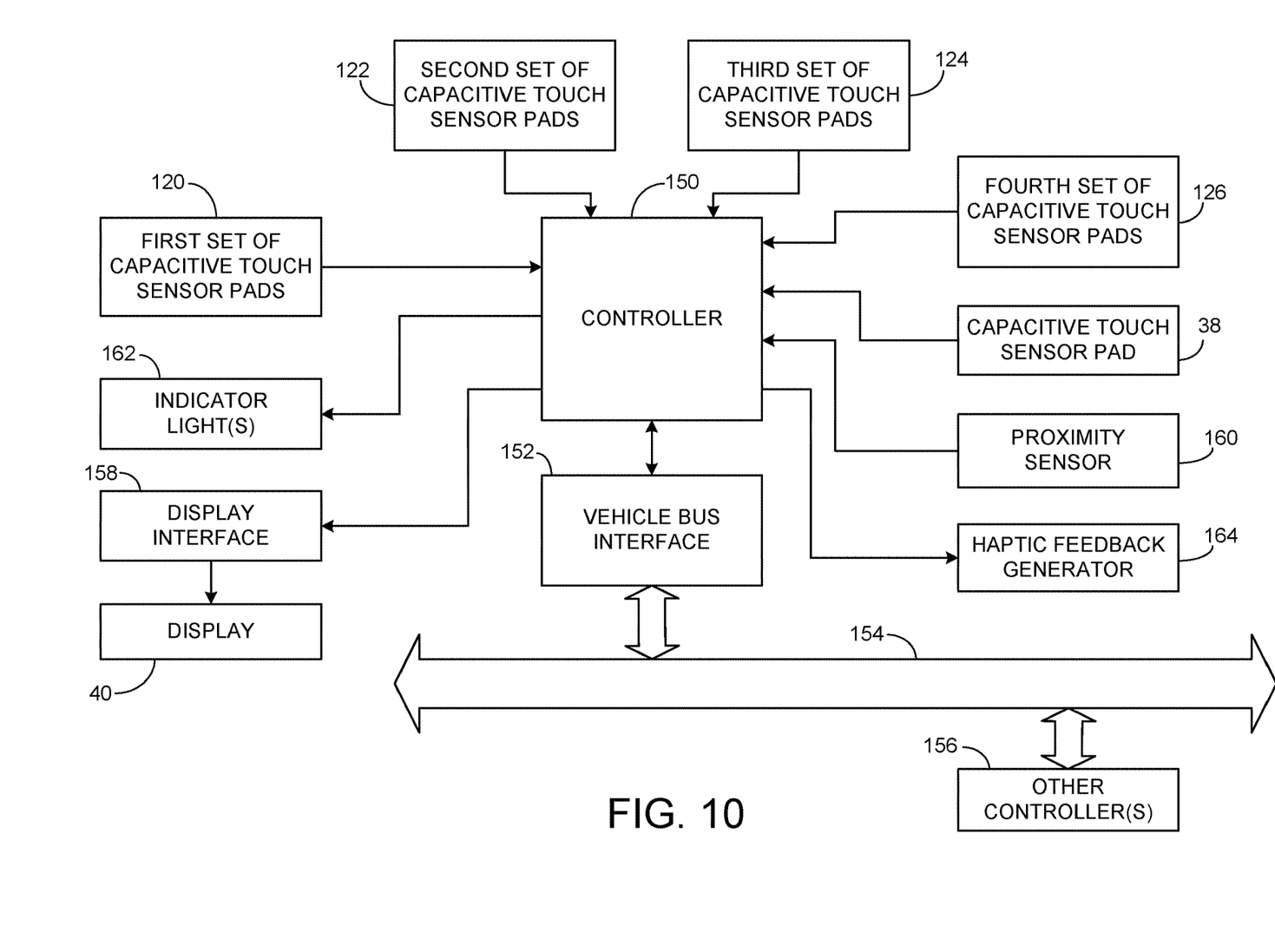
FIG. 10 is an electrical diagram in block form showing the electrical circuit of the vehicle shifter interface of FIGS. 1 and 9.

With reference to FIG. 10, a block electrical circuit diagram illustrates the electrical components of the above embodiment. As shown, a controller 150 is provided that is configured to receive the inputs from all of the capacitive touch sensor pads 30a-30e, 32a-32l, 34a-34e, and 36a-36e of the first set 120, second set 122, third set 124, and fourth set 126 as well as the input from capacitive touch sensor pad 38. The controller 150 may be coupled to a vehicle bus 154 via a bus interface 152 or the like. The controller 150 may be configured by programming to detect inputs from the capacitive touch sensor pads 30a-30e, 32a-32l, 34a-34e, 36a-36e, and 38 and either relay this information to other controllers via the vehicle bus 154 or to interpret this information and supply instructions to other controllers (such as controller 156) via the vehicle bus 154. For example, such instructions may be sent to a controller that controls the vehicle transmission to shift to a selected gear identified in the instructions sent from controller 150. Further, the instructions may include input selections for controlling or selecting information shown on the display 40, which may be sent over the vehicle bus 150 or directly to a display interface 158.

A proximity sensor 160 may also be provided in vehicle shifter interface 10 that is coupled to the controller 150 so as to sense when a driver's hand is proximate to the interface. The controller 150 may then activate certain indicator lights 162 that illuminate light patterns or indicia to allow the driver to identify the various input contours of the interface 10. Further, sensed proximity may also cause the controller 150 to switch the display 40 to a particular menu or display screen that may be manipulated by the inputs from the interface 10.

The interface 10 may also provide haptic feedback from a haptic feedback generator 164, which is coupled to the controller 150. In this case, the controller 150 may respond to any sensed input from the capacitive touch sensor pads 30a-30e, 32a-32l, 34a-34e, 36a-36e, and 38 by causing the haptic feedback generator 164 to vibrate. Such vibration may be generally provided across the interface 10 or may be provided at the specific contour 20-28 at which the input was sensed.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, and the length or width of the structures and/or members or other elements of the interface may be varied. It should be noted that the elements of the interface may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the claims as interpreted according to the principles of patent law, including the doctrine of equivalents.

What is claimed is:

1. A vehicle shifter interface comprising:
    a protruding contoured member including an outer surface having a first contour with a round shape and a second contour with a flat shape that is different from the round shape of the first contour, the protruding contoured member further having an inner surface, wherein the first contour and the second contour are spaced apart and located in different positions on the protruding contoured member, wherein the outer surface of the protruding contoured member further includes a third contour disposed along a first side of the protruding contoured member, wherein the outer surface of the protruding contoured member further includes a fourth contour disposed along a second side of the protruding contoured member opposite the first side, wherein the outer surface of the protruding contoured member further includes a fifth contour disposed on the top of the protruding contoured member, the first contour being disposed between the second contour and the fifth contour;
    a first set of capacitive touch sensor pads disposed on the inner surface of the protruding contoured member in an area underlying the first contour, the first set of capacitive touch sensor pads arranged and configured to provide output signals in response to a rotary movement of a driver's fingers about the round shape of the first contour thereby indicating a change in gear selection;
    a second set of capacitive touch sensor pads disposed on the inner surface of the protruding contoured member in an area underlying the second contour, the second set of capacitive touch sensor pads arranged and configured to provide output signals in response to at least one of a position of a driver's finger on the second contour and a change of position of a driver's finger along the second contour;
    a third set of capacitive touch sensor pads disposed on the inner surface of the protruding contoured member in an area underlying the third contour, the third set of capacitive touch sensor pads arranged and configured to provide output signals in response to a change of position of a driver's finger along the third contour;
    a fourth set of capacitive touch sensor pads disposed on the inner surface of the protruding contoured member in an area underlying the fourth contour, the fourth set of capacitive touch sensor pads arranged and configured to provide output signals in response to a change of position of a driver's finger along the fourth contour; and
    a capacitive touch sensor pad disposed on the inner surface of the protruding contoured member in an area underlying the fifth contour, the capacitive touch sensor pad configured to provide output signals in response to a detection of a driver's finger at the fifth contour.

2. The vehicle shifter interface of claim 1 and further comprising a haptic feedback generator for generating haptic feedback upon detection touching of any of the contours of the protruding contoured member.

3. The vehicle shifter interface of claim 1 and further comprising at least one indicator light.

4. The vehicle shifter interface of claim 3 and further comprising a proximity sensor for sensing proximity of a driver's finger to the vehicle shifter interface and for illuminating the at least one indicator light when proximity of a driver's finger is sensed.

5. The vehicle shifter interface of claim 1 and further comprising a display for displaying a gear selected using the vehicle shifter interface.

\* \* \* \* \*